United States Patent [19]

Toda

[11] Patent Number: 5,537,359
[45] Date of Patent: Jul. 16, 1996

[54] MEMORY DEVICE

[75] Inventor: Haruki Toda, Yokohama, Japan

[73] Assignee: Kabushiki Kaisha Toshiba, Tokyo, Japan

[21] Appl. No.: 343,111

[22] Filed: Nov. 22, 1994

[30]     Foreign Application Priority Data

Nov. 24, 1993 [JP]   Japan .................................. 5-293577

[51] Int. Cl.⁶ ...................................................... G11C 7/00
[52] U.S. Cl. ...................... 365/222; 365/189.12; 365/149
[58] Field of Search ..................................... 365/222, 221, 365/149, 189.12, 239, 240

[56]             References Cited

U.S. PATENT DOCUMENTS 4,739,500   4/1988   Miyamoto ........................... 365/222 X
5,053,997  10/1991   Miyamoto et al. ................. 365/222 X

FOREIGN PATENT DOCUMENTS 271067   6/1988   European Pat. Off. .
503504   9/1992   European Pat. Off. .

Primary Examiner—Joseph A. Popek
Attorney, Agent, or Firm—Loeb & Loeb

[57]                ABSTRACT

In a serial access memory device in which dynamic memory cells and serial registers are combined, the chip area occupied by the added serial registers can be reduced and thereby the cost of the memory chip can be reduced. The dynamic serial registers (SR) for reading data in series are provided in correspondence to the dynamic cell array (CA). When data are read under control of a transfer gate control block (X'fer CTL), the address is stored in an address compare block (X'fer Add). During the refresh of the cell array (CA) by a refresh control block (Ref CTL), the address of the cells being refreshed is given to the address compare block (X'fer Add). When both address match, the data of the cell array (CA) are transferred again to the serial registers (SR) through the transfer gate control block (X'fer CTL) to refresh the data of the serial registers.

24 Claims, 11 Drawing Sheets

MEMORY DEVICE

FIELD OF THE INVENTION

The present invention relates to a memory device, and more specifically to a memory device suitable for a semiconductor memory device provided with dynamic memory cells, in particular.

BACKGROUND OF THE INVENTION

With an increase in the capacity of the semiconductor memory device, memory devices of multibit (e.g., ×16 or ×32 bits) construction have been required more and more. Further, the memory devices provided with a serial access function have been increased in order to increase the data input/output speed.

In particular, where image data are handled, a high speed serial access memory device is indispensable. Accordingly, in the memory device, such a construction that data are first transferred simultaneously in parallel and then outputted in series has been adopted recently. This method has been developed to transfer data at high speed by providing a parallel-serial transforming circuit in the data input/output sections. Therefore, in the case of a field memory or a video RAM, registers are provided to store data for one row of the cell array simultaneously and then output the stored data in series.

On the other hand, with the advance of the memory capacity and the number of bits (multibit), such a construction has been adopted that the memory cells are divided into a number of memory cell arrays and further object memory cells are further selected from a selected memory cell array, in order to decrease the power consumption and increase the data transfer speed. In particular, in the case of the dynamic type memory cells, since minute cell data must be sensed and further amplified, it is indispensable to divide the cell array into cell groups within a data sensible range. In the memory device constructed as described above, when the serial read function is required, it is necessary to provide registers for parallel-serial transformation for each cell array.

FIG. 5 shows a general memory construction of a 4M video RAM of 256 k×16 cells, by way of example. In this memory device, each cell array is composed of 128 kbit cells. In FIG. 5, regions B show the register sections for parallel-serial transformation, and each register section is composed of 256 bit registers. On the other hand, each cell array region C includes mechanisms (e.g., sense amplifiers) for access to cell information. As understood by the comparison between the regions C and the regions B in FIG. 5, the ratio of the chip area occupied by the regions B including the parallel-serial transforming sections to the total chip area is fairly large.

Further, FIG. 6 shows a register for one column (which corresponds to an area A in FIG. 5). As shown in FIG. 6, a word line pair WL(A) and WL(B) connected to a memory cell pair MC is connected to a sense amplifier SA via two bit lines B and /B. Further, the sense amplifier SA is connected to serial register SR through transfer gates TG. To the serial register SR, a high potential supply voltage Vcc and a low potential supply voltage Vss are both supplied. Further, the serial register SR is connected to a data line pair DQ and /DQ via select gates SG. The transfer gates TG are controllably turned on or off in response to a transfer gate signal X'fer G, and the select gates SG are controllably turned on or off in response to a gate select signal SL.

The operation of the above-mentioned register will be described hereinbelow.

When any of the word line WL(A) or WL(B) is activated, data of the memory cell pair MC is developed on the bit line pair B or/B. A small potential difference based upon the cell data is amplified by the sense amplifier SA. The above operation is executed in common for both the data refresh of the memory cell MC and the data read on the object word line WL(A) or WL(B).

Here, in a command cycle for transferring the read data to the serial register SR in parallel, after the sensing operation by the sense amplifier SA ends, the sensed data is transferred to the serial register SR. In other words, after the potentials of the bit line pair B and/B have been sensed sufficiently by the sense amplifier SA, the transfer gate signal X'fer G rises to open the transfer gates TG, so that the content of the serial register SR is written to the data of the sense amplifier SA. This rewrite operation is executed at the same time in all the 256-bit registers (in all the rows).

After the data have been written to the serial registers SR, the transfer gates TG are closed. After that, the select gates SG connected between the serial register SR and the data line pair DQ and/DQ are opened one by one on the basis of the gate select signal SG, so that data can be transferred to the outside in series through the data line pair DQ and/DQ.

Further, the serial register SR is of CMOS flip-flop, which can hold the data until the high potential supply voltage Vcc and the low potential supply voltage Vss are both once turned off.

FIG. 7 shows a circuit functional block for realizing the above-mentioned operation.

In FIG. 7, a word line control block WL CTL selects the word line WL(A) or WL(B) and controls the sense operation of the cell array CA.

Here, the selected word line WL(A) or WL(B) is any one of the word line which correspond to the data-read row in the case of the data transfer command cycle, and any one of the word line obtained when all the word line WL(A) and WL(B) are selected cyclically at a predetermined sequence in the case of the refresh command cycle.

Further, the transfer gate control block X'fer CTL gives a word line address to be transferred to the word line control block WL CTL in the transfer command cycle, so that data of the cell array CA (whose address is designated) can be sensed by the sense amplifier SA via the word line WL(A) and WL(B) and the bit line pair B or/B. Further, the data sensed by the sense amplifier SA is transferred to the serial register SR (as the parallel-serial transforming circuit) by applying the transfer gate signal X'fer G to the transfer gates TG.

On the other hand, the refresh control block Ref CTL generates an address at predetermined sequence to refresh the dynamic cell array CA in sequence, and transmits the generated address to the word line corresponding to the designated address, so that the memory cell can be refreshed through the word line sensing operation.

In the conventional memory device constructed as described above, however, there exists a problem in that the ratio of area occupied by the serial registers to the total chip area becomes relatively large. In other words, even in the case where the serial registers are added to the general-purpose DRAM to form a field memory or an image memory, it is of course necessary to suppress the area occupied by the serial registers as small as possible, that is, it is one of the important factors to reduced the chip area for reduction of the manufacturing cost of the memory device. This is because where the serial registers are added to the DRAM, if the chip areas occupied by the registers increases excessively beyond some extent, the cost of the memory device provided with the serial registers increases beyond that of the general-purpose DRAM. Therefore, conventionally, in the case where the serial registers used to read data in series are additionally incorporated in the ordinary DRAM, there exists a problem in that it has been difficult to suppress an increase of the chip area occupied by the serial registers, that is, to reduce the manufacturing cost of the memory chip.

SUMMARY OF THE INVENTION

With these problems in mind, therefore, it is the object of the present invention to provide a memory device of dynamic memory cells provided with serial registers, which can reduce an increase in chip area occupied by the additional serial registers as much as possible to decrease the cost of the memory chip.

To achieve the above-mentioned object, the present invention provides a memory device, comprising: a memory cell array composed of a plurality of memory cells arranged into a matrix pattern; a register for transmitting and/or receiving data to and/or from the memory cells for one row of said memory cell array, and further for outputting and/or inputting data to and/or from the outside; and control means, during a period when data transferred from the memory cells for one row of said memory cell array to said register are valid, for accessing the memory cells for the same row of said memory cell array from which the data have been transferred to said register and further transferring the same data to said register again, to refresh the data in said register.

Each of the memory cells for constituting said memory cell array is of dynamic type memory cell; and said control means refreshes the memory cells row by row in sequence.

The register is composed of a plurality of register cells required to be refreshed in the same way as in the dynamic type memory cell. The register cell is composed of first and second transistors connected in series between complementary first and second data output lines, an intermediate junction point of said two transistors being connected to any one of a supply voltage line and a ground line, a control terminal of said first transistor being connected to the second data output line and a control terminal of said second transistor being connected to the first data output line, respectively.

The first and second transistors of the register cell are of N- or P-channel transistors. Further, the register is of serial register.

Further, the control means executes re-transfer operation such that a row address of one-row data transferred from said memory cell array to said register is stored and held as a transferred row address of said memory cell array; a row address whose data now being refreshed is compared with the transferred row address during the refresh operation; and when both match, data of the row corresponding to the transferred row address are transferred again to said register.

The re-transfer operation is repeated in a time shorter than shorter one of the data holding time of said memory cells and that of said register cells.

The memory device is composed of said single memory cell array and said single register; and data are inputted and outputted between said memory cell array and the outside via said single register in series. Further, the memory device is composed of said single memory cell array and said two registers; and data are inputted and outputted between said memory cell array and the outside in such a way that data are inputted from one of said two registers in series and the inputted data are inputted to the other of said two registers via said memory cell array, and the data are outputted to the outside in series from the other register.

Data are transferred between the memory cells for one row of the memory cell array and the serial registers. In the data transfer from one row cells of the memory cell array to the serial registers, during the period in which the transferred data are valid, the access and the transfer to the same row are executed, and further the data in the serial registers are refreshed. Specifically, the address of the memory cell array from which data are transferred is compared with the address of the row related to the refresh operation of the memory cell array. In the case of match of both, data are transferred again from the row of the memory cell array to the serial registers for refresh of the serial registers.

DETAILED DESCRIPTION OF THE EMBODIMENT

An embodiment of the memory device according to the present invention will be described hereinbelow with reference to FIG. 1, in which only one column construction is shown.

Figure 1:
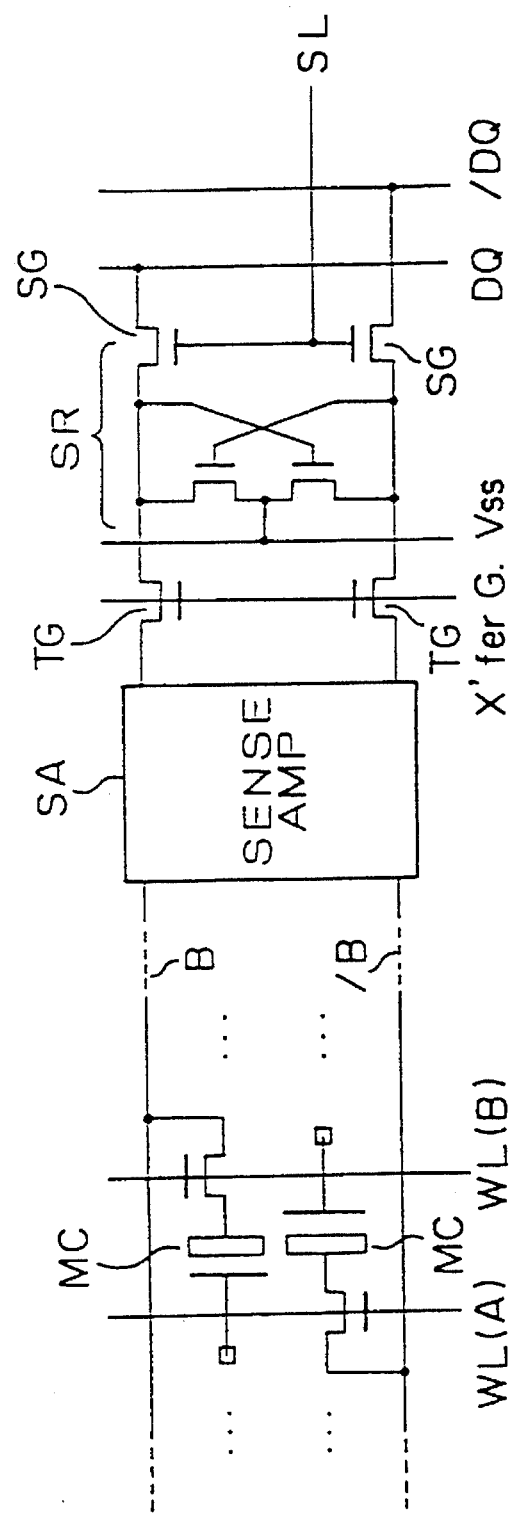
FIG. 1 is a block diagram showing memory device for one column of an embodiment of the present invention.

In FIG. 1, a serial register SR is of dynamic register type composed of only two N-channel MOS transistors. In FIG. 1, the same reference numerals have been retained for the similar elements which have the same functions as with the conventional memory device previously described with reference to FIG. 6, without repeating any detailed description thereof.

Figure 6:
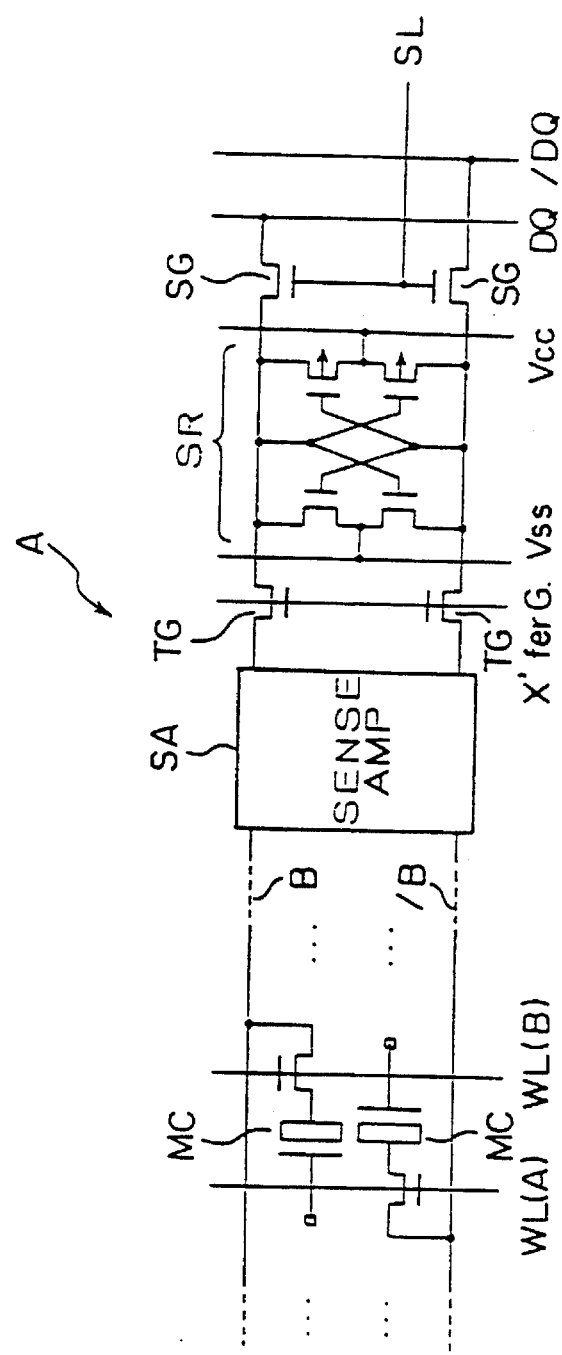
FIG. 6 is a block diagram showing a conventional one-column memory device, which corresponds to the region A shown in FIG. 5.
Figure 7:
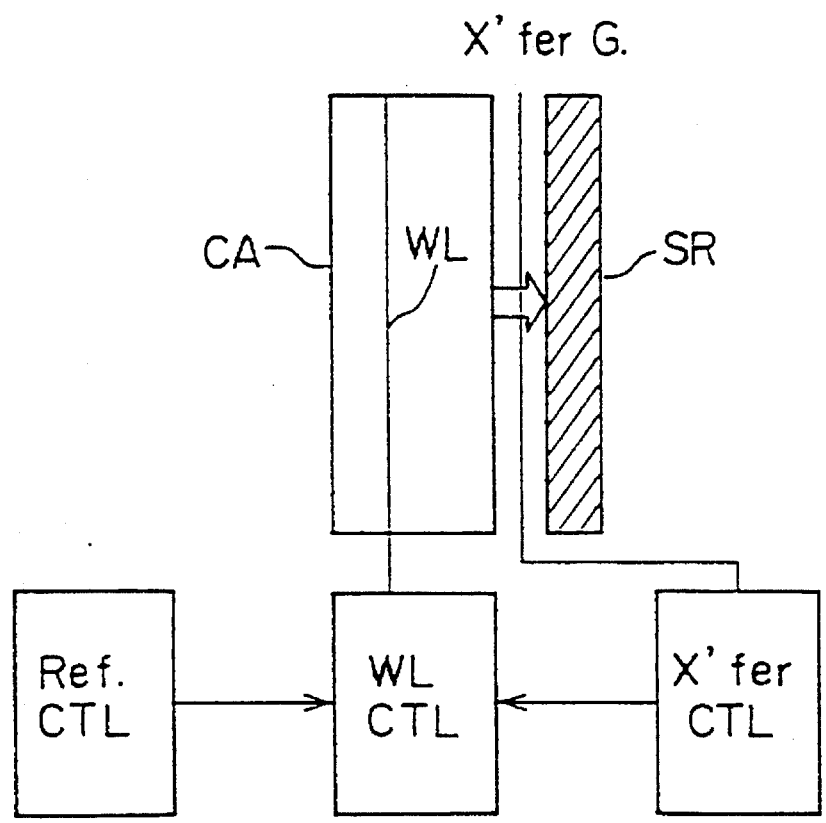
FIG. 7 is a functional circuit block diagram applied to the conventional construction shown in FIG. 6.

In the present invention, since the dynamic type structure is adopted for the serial register SR, it is possible to reduce the circuit scale down to a half of that of the conventional serial register SR shown in FIG. 6, with the result that the chip area occupied by the serial registers SR can be reduced about half as compared with that of the conventional memory device.

In the present invention, however, since the serial register SR is of dynamic type instead of the conventional flip-flop type (provided with data holding function), although the chip area can be reduced half, data can be held only within a predetermined time.

In other words, the data hold time of the serial register SR of the present invention is a time period during which charges at the respective nodes thereof are discharged due to leakage, which is roughly the same as that during which a charge of the dynamic cell is discharged. As a result, in order to hold the data in the serial register SR, it is necessary to refresh the register data, in the same way as with the case of the dynamic memory cell.

On the other hand, since the memory cell MC is of dynamic type, the sense operation is necessarily executed as the refresh operation, by selecting the word line WL(A) or WL(B) belonging to a cell MC within a constant period. This operation is executed within a period during which memory cell data is sufficiently kept decided as information. Therefore, in the present invention, the above-mentioned data hold period is determined on the basis of any shorter one of the data hold period of the dynamic serial register SR and the data hold period of the dynamic memory cell MC. However, since both the hold time periods are roughly the same with respect to each other, even if a shorter period of both is determined as the above-mentioned operation, it is unnecessary to execute the refresh operation at frequent intervals.

If the content of the serial register SR can be refreshed within the period determined as described above, it is possible to set the same conditions as those of the CMOS type flip-flop whenever serial data are read. In other words, it is possible to secure the serial register (SR) data, even when data are read at a relatively long period or intermitted for a long time.

Figure 2:
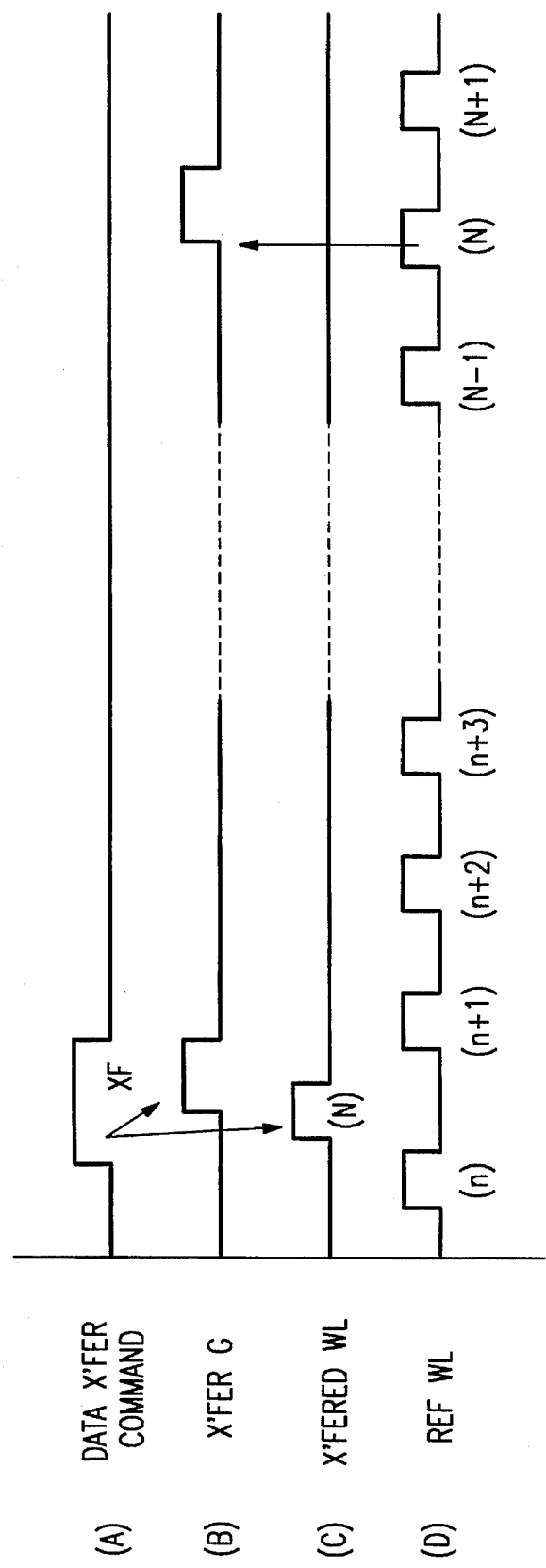
FIG. 2 is a timing chart for assistance in explaining the operation of the construction shown in FIG. 1.

FIG. 2 shows the refresh operation of the serial register SR shown in FIG. 1. In FIG. 2, (A) denotes a data transfer command outputted to read data from the memory cell MC; (B) denotes a transfer gate signal X'fer G for transferring the data sensed by the sense amplifier SA to the serial register SR via the transfer gates TG; (C) denotes a word line data transfer signal X'fer WL given to the memory cell as an address to read data from the memory cell; and (D) denotes a word refresh signal Ref WL given to the memory cell to refresh the memory cell.

When the data transfer command does not exist and further data is not transferred from the memory cell MC to the serial register SR, the word line is selected in sequence in a cell refresh cycle on the basis of the word line refresh signal Ref WL. That is, the word line WL(A) or WL(B) is selected in sequence by designating the memory cell addresses in sequence-as n, n+1, N+2, n+3, ... N–1, N, N+1. In this cycle, the memory cells are refreshed.

After that, in the data transfer cycle, as shown in FIG. 2(A), the data transfer command is inputted. In this cycle as shown in FIG. 2(C), an address N of a row from which memory cell data is to be transferred is given as the word line data transfer signal X'fer WL. Therefore, the word line WL(A) or WL(B) corresponding to the address N can be selected, and the memory cell data is sensed by the sense amplifier SA via the bit line pair B and /B. Further, as shown in FIG. 2(B), the transfer gate signal X'fer G rises to transfer the sensed data to the serial register SR via the transfer gates TG.

Here, it should be noted that a refresh is made to the memory cell at the address N from which data is transferred. In the same way, a refresh is made to the serial register SR to which data is transferred from the sense amplifier SA, so that the data written from the sense amplifier SA to the serial register SR is kept held in a predetermined period beginning from this time point.

As described above, after the data transfer cycle has completed, as shown in FIG. 2(D), the word line refresh signal Ref WL selects the memory cell addresses in sequence and further activates the word line WL(A) or WL(B) in sequence, so that the refresh operation of the memory cells is kept executed. Therefore, after the transfer cycle ends, that is, the refresh address becomes N, it is possible to refresh the serial register SR in accompany with the memory cell refresh by transferring the sense amplifier (SA) data to the serial register SR via the transfer gates TG by raising the transfer gate signal X'fer G, as shown in FIG. 2(B). Therefore, the serial register SR can hold the data of the serial register SR.

Further, the refresh cycle time of the memory cell is determined to one shorter period of the data hold time of the serial register SR and the refresh period required for the memory cell, the data of the memory cell and the data of the serial register SR can be both held. Further, the time interval between when the memory cell address N (from which data is transferred) is selected for data read and when the succeeding memory cell address N is selected by refresh is determined shorter than one refresh period of the memory cell, the data of the serial register SR can be held securely.

Figure 3:
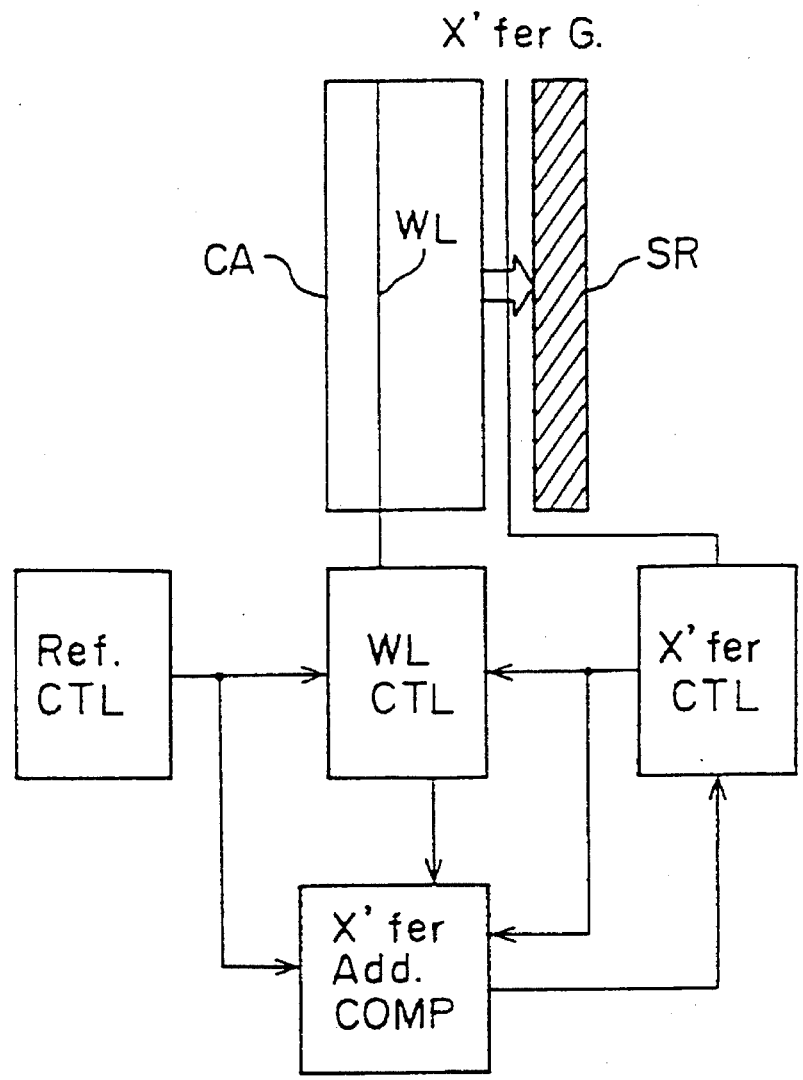
FIG. 3 is a functional circuit block diagram applied to the construction shown in FIG. 1.

FIG. 3 is a functional circuit block for realizing the above-mentioned operation. As shown in FIG. 3, a refresh control block Ref CTL, a word line control block WL CTL and a transfer gate control block X'fer CTL are all connected to an address compare block X'fer Add.

In the construction as described above, in the data transfer cycle, the word line WL(A) or WL(B) corresponding to an address of the cell array CA (from which data is read) are activated by the word line control block WL CTL. Further, the transfer gate signal X'fer G is given from the transfer gate control block X'fer CTL to the transfer gates TG to sense the cell array data through the word line WL(A) or WL(B), so that the sensed data are transferred from the sense amplifier SA to the serial registers SR via the transfer gates TG.

At this time, in accompany with the data transfer from the transfer gate control block X'fer CTL, the address of the cell array designated by the word line control block WL CTL is stored by the address compare block X'fer Add.

On the other hand, in the cycle other than the data transfer cycle, the cell array CA is refreshed in sequence by supplying the refresh addresses in sequence from the refresh control block Ref CTL to the word line control block WL CTL.

For each refresh cycle, the address supplied from the word line control block WL CTL to the cell array CA is compared with the address stored in the address compare block X'fer Add. When both the addresses match, the transfer gate signal X'fer G is outputted by controlling the transfer gate control block X'fer CTL. As a result, since the transfer gates TG interposed between the sense amplifier SA and the serial register SR are opened, the data read from the cell array CA is transferred from the sense amplifier SA to the serial register SR via the transfer gates TG, so that the serial register SR can be refreshed.

As described above, in the memory device provided with the serial access function such that the serial registers are required for parallel-serial transformation for each array due to an increase in both memory capacity and the number of cell arrays, it is possible to reduce the chip area occupied by the parallel-serial transformation by changing the register structure from the static type to the dynamic type. In this case, although the data must be held, since the parallel-serial transforming registers are refreshed in accompany with the refresh operation of the memory cells, it is possible to realize the memory device provided with the function quite the same as that of the memory device which uses the static type shift registers.

Here, the cases where the construction of the present invention becomes effective in particular will be described hereinbelow.

Figure 4:
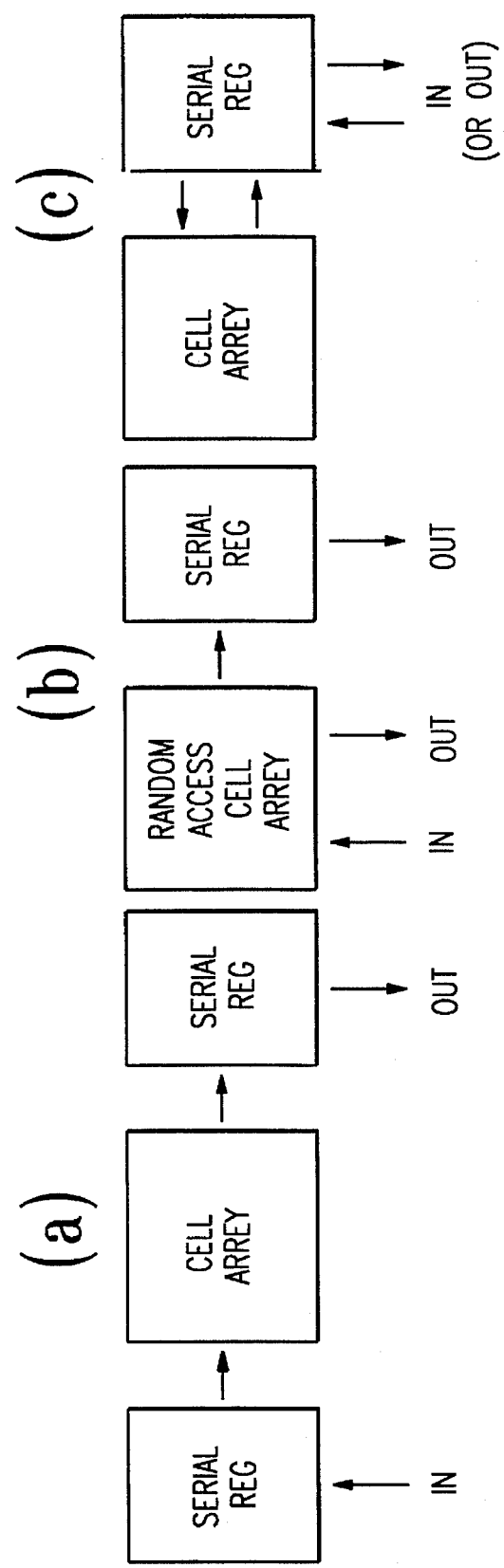
FIGS. 4(a) to 4(c) are memory constructions of different types provided with the serial register at the input/output sections thereof.
Figure 5:
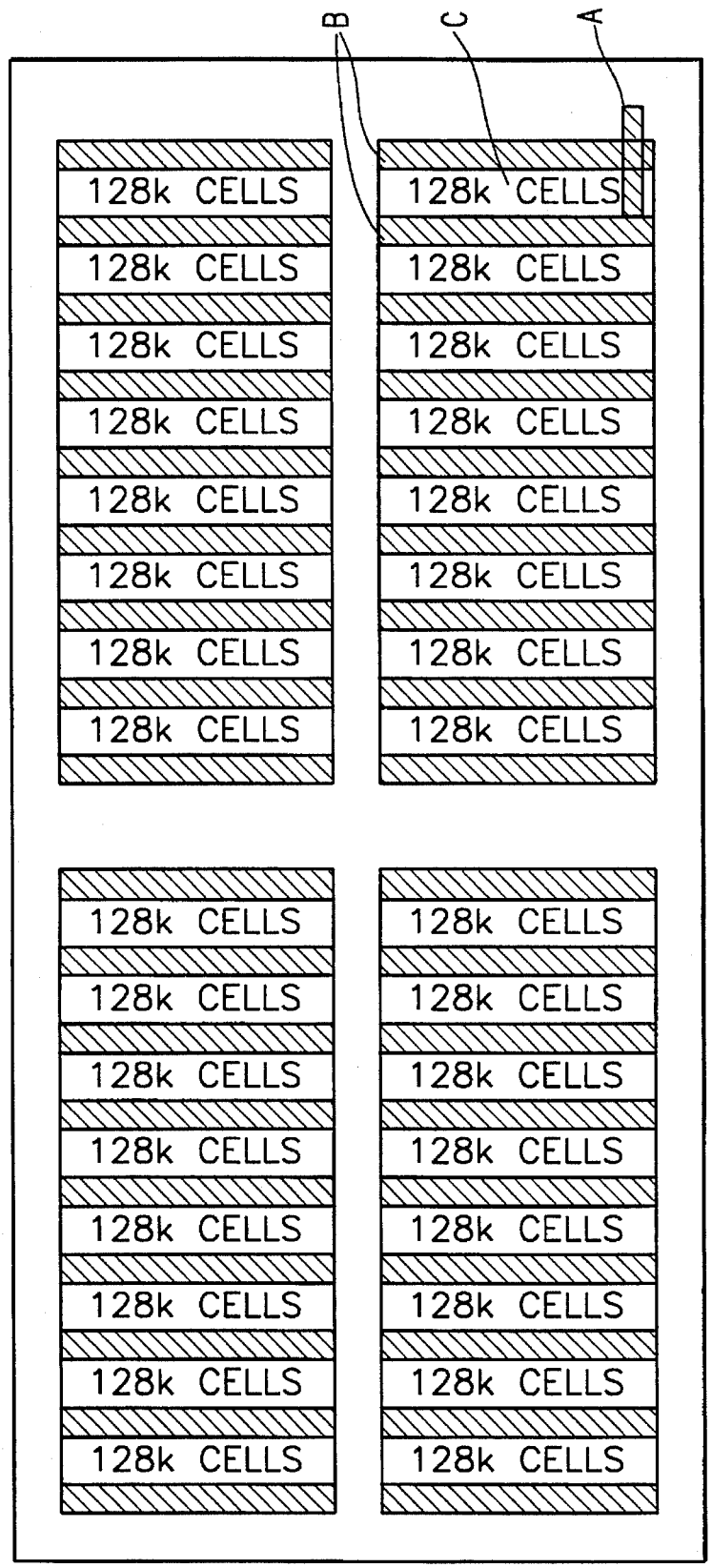
FIG. 5 is a general memory construction diagram.

FIGS. 4(a) to (c) show a few kinds of the memory device constructions provided with the serial register at both the input/output sections, respectively.

In the case of the structure shown in FIG. 4(a), data are inputted from the serial register (in) to the cell array, and further the data are read from the cell array through another serial register (out), which is referred to as FIFO (first-in (write) first-out (read)) type memory.

In this structure, two serial registers are arranged to one cell array. Data are transferred in series from the serial register (in) to the cell array row by row for serial data write. After that, the data read in the cell array rows are transferred to the other serial register (out) in the order of the written data sequence for serial data read.

In the memory device of this construction, the cell array data will not be rewritten in one cycle from when data are inputted to the memory cell array in series to when the data are outputted in series. In other words, since the address data of the cell array word line (through which the data has been outputted and transferred in series) does not change, it is possible to apply the memory device of the present invention to this construction.

On the other hand, in the case of the construction as shown in FIG. 4(b), a serial register (out) is provided for a random access memory cell array (in, out) so that the data can be outputted in series, which is of multiport type.

The feature of this memory is that when data are being read in series through the serial register (out), data can be inputted in and outputted from the random access cell array section independently. Therefore, the cell data at the word line address transferred to the serial register is being updated when the data are being read through the serial register.

Accordingly, in this case, since it is impossible to refresh both the random access cell array and the serial register on the basis of the same data, the memory device of the present invention cannot be applied to this construction.

In contrast with this, in the structure as shown in FIG. 4(c), data are written in the cell array through one serial register (in or out), and further read from the cell array through the same serial register. In this memory device, therefore, the period during which data are inputted in series is different from the period during which data are outputted in series. In other words, as far as data are being outputted in series, since the data of the cell array will not be updated, it is possible to apply the memory device of the present invention effectively to this construction.

Figure 1A:
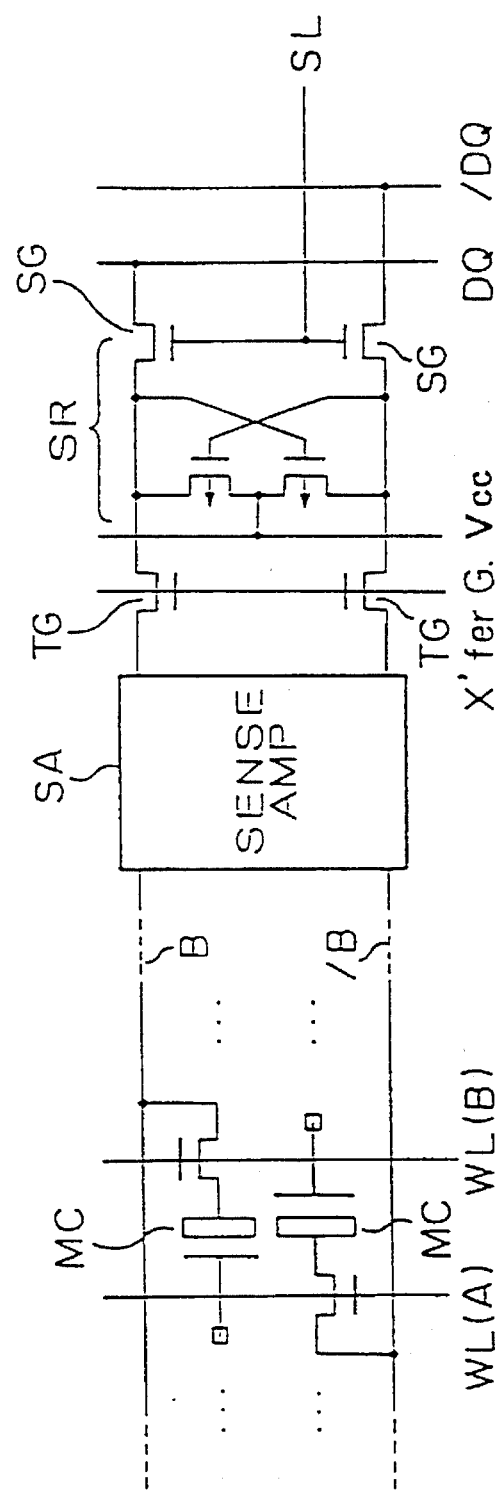
FIG. 1A is a block diagram showing a modification of the memory device shown in FIG. 1.

Further, in the above-mentioned embodiment, although the serial register SR is of dynamic type register formed of N-channel MOS transistors, without being limited only thereto, it is of course possible to obtain the same effect when the serial register SR is formed by P-channel MOS transistors, as shown in FIG. 1A.

Figure 8:
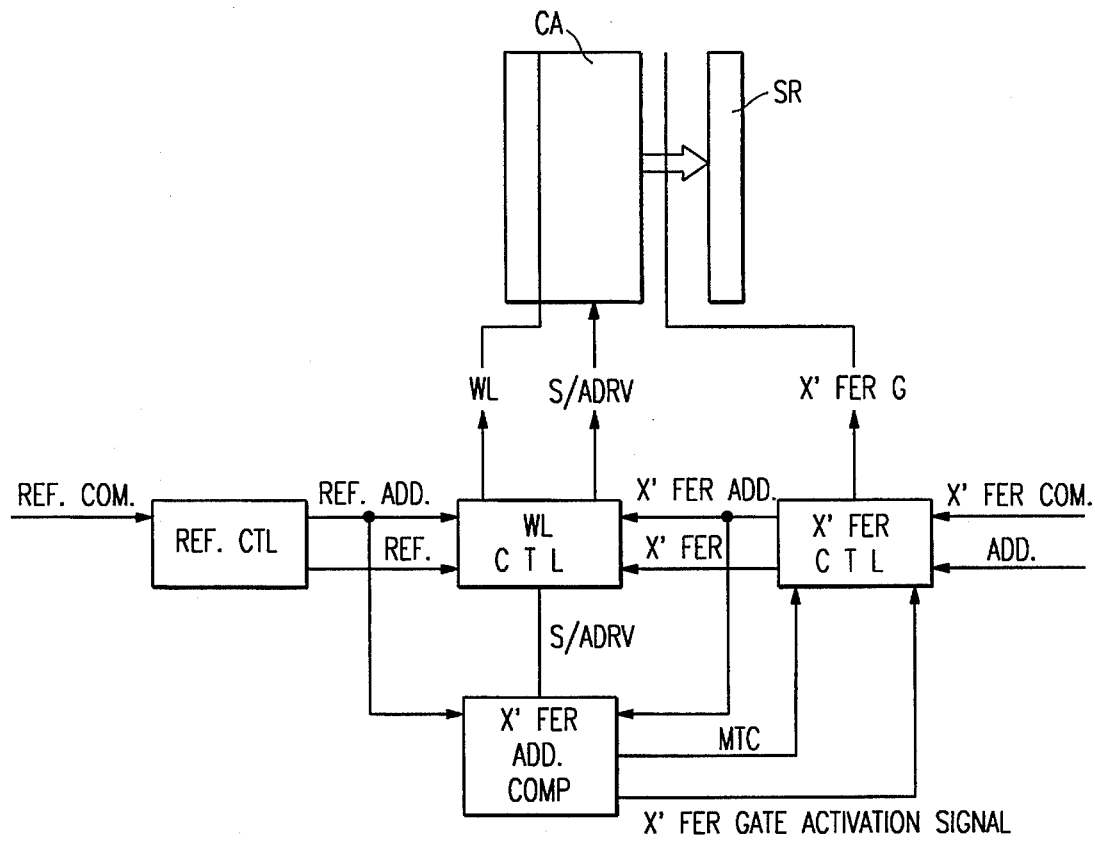
FIG. 8 is a block diagram showning the functional circuit blocks shown in FIG. 3 in more practical way.

In addition, FIG. 8 is a block diagram showing the functional block circuit shown in FIG. 3 in more practical way. Further, the respective blocks shown in FIG. 8 are depicted in FIGS. 9 to 11 in more practical way.

Figure 9:
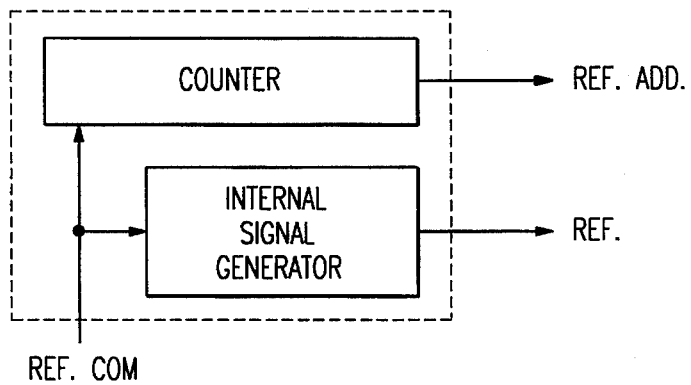
FIG. 9 is a block diagram showing a more practical example of the refresh control block shown in FIG. 8.

That is, FIG. 9 is a block diagram showing the refresh control block Ref. CTL. This block counts up the counter in response to the refresh command Ref. Com to generate a new refresh address Ref. Add. In addition, this block generates a refresh signal Ref. for controlling the refresh operation in response to the refresh command Ref. Com.

Figure 10:
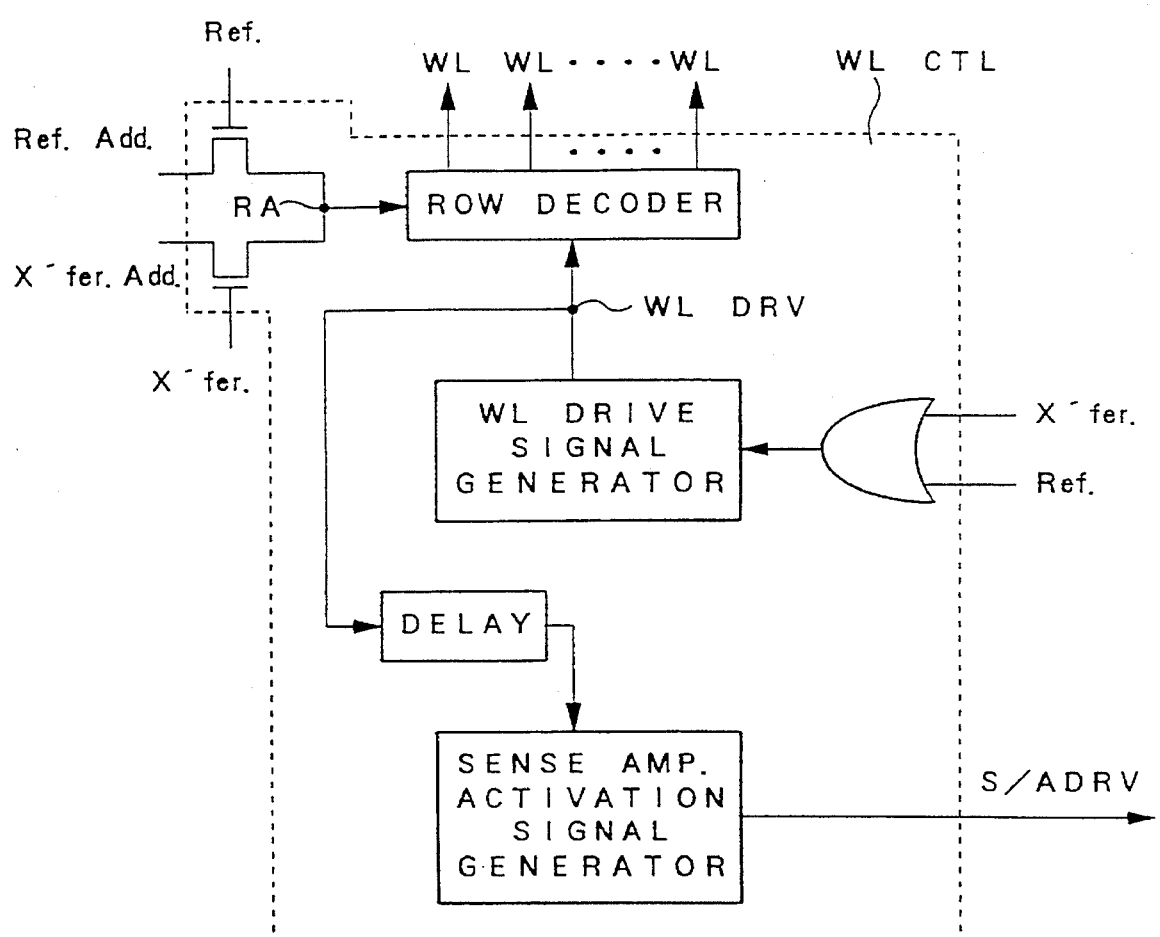
FIG. 10 is a block diagram showing a more practical example of the word line control block shown in FIG. 8.

FIG. 10 is a block diagram showing the word line control block WL CTL. This block transmits either of the transfer address X'fer Add. or the refresh address Ref. Add. given by the refresh control block Ref. CTL to the row decoder as a signal RA according to the respective modes. On the basis of the signal RA and the signal WL DRV given by a word line drive signal generator, the row decoder activates one of the word lines WL, WL, ..., WL corresponding to the signal RA. The word line signal generator for generating the signal WL DRV and a sense amplifier activation signal generator for generating a signal S/ADRV shown in FIG. 10 are the well known circuits usually used in an ordinary DRAM. The word line drive signal generator activates the signal WL DRV in response to either of the signal X'fer or the signal Ref, that is, according to either mode. Further, although the sense amplifier activation signal generator outputs the signal S/ADRV, this signal S/ADRV is activated later than the signal WL DRV.

Figure 11:
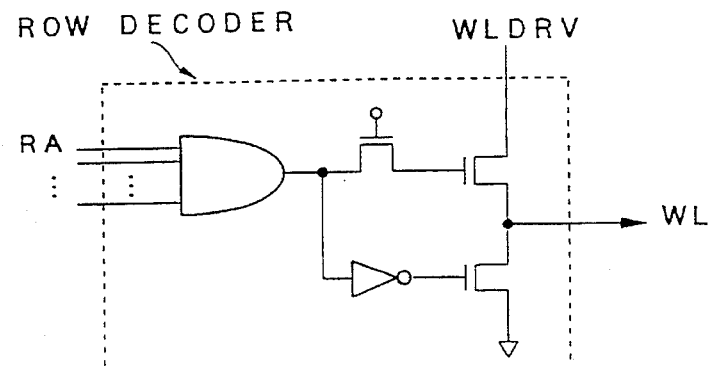
FIG. 11 is a circuit diagram showing a more practical example of the row decoder shown in FIG. 8.

FIG. 11 shows the row decoder shown in FIG. 10. This row decoder activates the signal WL in accordance with the decoded signal selected on the basis of combinations of the signals RA.

Figure 12:
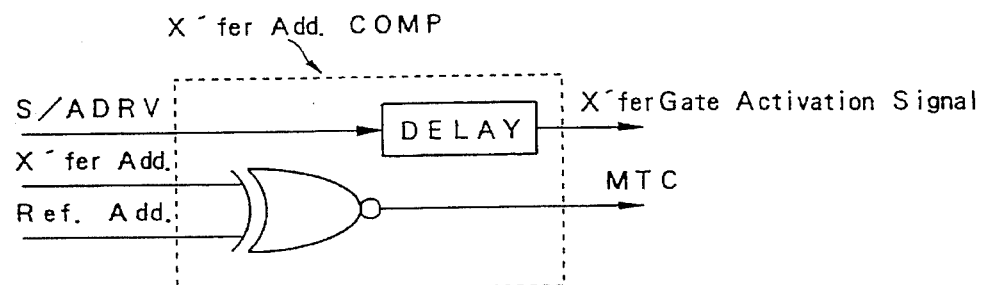
FIG. 12 is a circuit diagram showning a more practical example of the transfer address compare block shown in FIG. 8.

FIG. 12 shows the transfer address compare block X'fer Add. COMP. This block compares the latched transfer address X'fer Add with the refresh address Ref. Add., and generates a match signal MTC when both match each other. Further, this transfer address compare block X'fer Add. delays the signal S/ADRV and generates it as the transfer gate activation signal.

Figure 13:
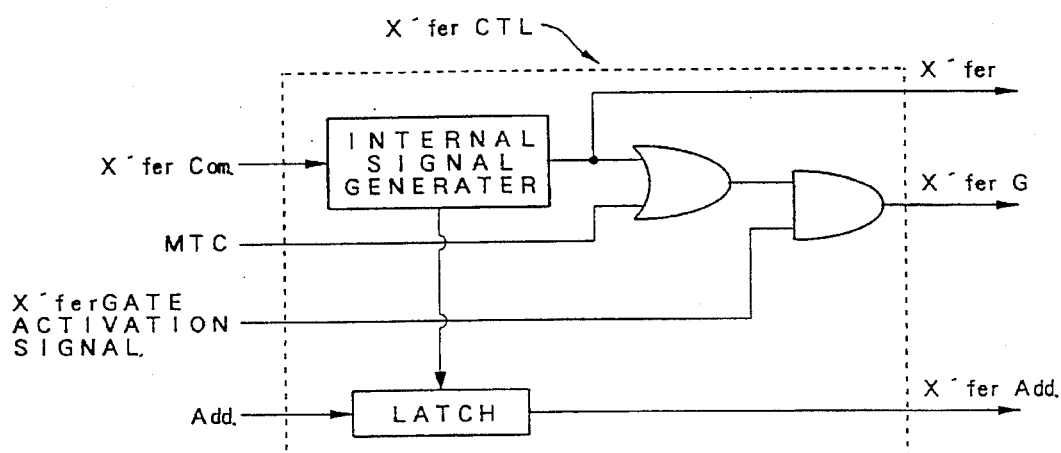
FIG. 13 is a circuit diagram showing a more practical example of the transfer gate control block shown in FIG. 8.

FIG. 13 shows the transfer gate control block. This block is activated in response to the transfer command X'fer Com, and generates the transfer signal X'fer for control. Further, in response to either of the match signal MTC or the transfer signal X'fer and additionally to the transfer gate activation signal, this block activates the transfer gate signal X'fer G for implementing the transfer operation. Further, in the transfer mode, this block latches the address Add and generates the transfer address X'fer Add.

As described above, in the memory cell according to the present invention, since the dynamic serial registers are provided for the dynamic memory cells to output data in series, and further since the serial registers can be refreshed in accompany with the refresh of the memory cells in such a way that data can be held by the serial registers, it is possible to reduce the chip area occupied by the serial register section, thus reducing the manufacturing cost thereof.

According to the present invention, after data have been transferred from the memory cell array to the serial registers, since the serial registers are refreshed by transferring data again from the memory cells to the serial registers within the period during which data in the serial registers are valid, it is possible to reduce the area occupied by the serial registers to the total memory area markedly.

What is claimed is:

1. A memory device, comprising:

a memory cell array composed of a plurality of memory cells arranged into a matrix pattern;

a register for transmitting and/or receiving data to and/or from the memory cells for one row of said memory cell array, and further for outputting and/or inputting data to or from the outside; and control means, during a period when data transferred from the memory cells for one row of said memory cell array to said register is valid, for accessing the memory cells for the same row of said memory cell array from which the data have been transferred to said register and further transferring the same data to said register again, to refresh the data in said register.

2. The memory device of claim 1, wherein each of the memory cells for constituting said memory cell array is a dynamic type memory cell; and said control means refreshes the memory cells row by row in sequence.

3. The memory device of claim 1, wherein said register is composed of a plurality of register cells required to be refreshed in the same way as a dynamic type memory cell.

4. The memory device of claim 3, wherein said control means executes a re-transfer operation such that a row address of one-row data transferred from said memory cell array to said register is stored and held as a transferred row address of said memory cell array; a row address whose data now being refreshed is compared with the transferred row address during the refresh operation; and when both match, data of the row corresponding to the transferred row address are transferred again to said register.

5. The memory device of claim 4, wherein the re-transfer operation is repeated in a time shorter than the shortest one of the data holding time of said memory cells and the data holding time of said register cells.

6. A memory device, comprising:

a memory cell array composed of a plurality of memory cells arranged into a matrix pattern;

a register for transmitting and/or receiving data to and/or from the memory cells for one row of said memory cell array, and further for outputting and/or inputting data to or from the outside; and control means, during a period when data transferred from the memory cells for one row of said memory cell array to said register is valid, for accessing the memory cells for the same row of said memory cell array from which the data have been transferred to said register and further transferring the same data to said register again, to refresh the data in said register, wherein each of the memory cells for constituting said memory cell array is a dynamic type memory cell; and said control means refreshes the memory cells row by row in sequence, wherein said register is composed of a plurality of register cells required to be refreshed in the same way as in the dynamic type memory cell, and wherein the plurality of register cells are composed of first and second transistors connected in series between complementary first and second data output lines, an intermediate junction point of said first and second transistors being connected to any one of a supply voltage line and a ground line, a control terminal of said first transistor being connected to the second data output line and a control terminal of said second transistor being connected to the first data output line, respectively.

7. The memory device of claim 6, wherein the first and second transistors of the register cell are N-channel transistors.

8. The memory device of claim 7, wherein said register is a serial register.

9. The memory device of claim 8, wherein the memory device is composed of said memory cell array and said register; and data are inputted and outputted between said memory cell array and the outside via said register in series.

10. The memory device of claim 8, wherein the memory device is composed of said memory cell array and said first and second transistors; and data are inputted and outputted between said memory cell array and the outside in such a way that data are inputted from one of said first and second transistors in series and the inputted data are inputted to the other of said first and second transistors via said memory cell array, and the data are outputted to the outside in series from the other of said first and second transistors.

11. The memory device of claim 7, wherein said control means executes a re-transfer operation such that a row address of one-row data transferred from said memory cell array to said register is stored and held as a transferred row address of said memory cell array; a row address whose data now being refreshed is compared with the transferred row address during the refresh operation; and when both match, data of the row corresponding to the transferred row address are transferred again to said register.

12. The memory device of claim 6, wherein the first and second transistors of the register cell are P-channel transistors.

13. The memory device of claim 12, wherein said register is a serial register.

14. The memory device of claim 13, wherein the memory device is composed of said memory cell array and said register; and data are inputted and outputted between said memory cell array and the outside via said register in series.

15. The memory device of claim 13, wherein the memory device is composed of said memory cell array and said first and second transistors; and data are inputted and outputted between said memory cell array and the outside in such a way that data are inputted from one of said first and second transistors in series and the inputted data are inputted to the other of said first and second transistors via said memory cell array, and the data are outputted to the outside in series from the other of said first and second transistors.

16. The memory device of claim 12, wherein said control means executes a re-transfer operation such that a row address of one-row data transferred from said memory cell array to said register is stored and held as a transferred row address of said memory cell array; a row address whose data now being refreshed is compared with the transferred row address during the refresh operation; and when both match, data of the row corresponding to the transferred row address are transferred again to said register.

17. The memory device of claim 6, wherein said control means executes a re-transfer operation such that a row address of one-row data transferred from said memory cell array to said register is stored and held as a transferred row address of said memory cell array; a row address whose data now being refreshed is compared with the transferred row address during the refresh operation; and when both match, data of the row corresponding to the transferred row address are transferred again to said register.

18. The memory device of claim 17, wherein the re-transfer operation is repeated in a time shorter than the shortest one of the data holding time of said memory cells and the data holding time of said register cells.

19. A memory device, comprising:

bit line pairs each having two bit lines;

memory cells connected to each of the bit line pairs, each of the memory cells having a first transistor and a capacitor connected in series to the first transistor;

word lines each for activating some of the first transistors of the memory cells;

sense amplifiers each connected to each of the bit line pairs, for sensing and amplifying data read from the memory cells to each of the bit line pairs;

serial registers each connected to each of the sense amplifiers, each serial register having second and third transistors connected in series between each of the bit line pairs, a gate of the second transistor connected to one side of the bit line pair being connected to the other side of the bit line pair, and a gate of the third transistor connected to the other side of the bit line pair being connected to the one side of the bit line pair, respectively;

transfer gates each connected between each of the sense amplifiers and each of the serial registers;

a data line pair for receiving data from each of the serial registers;

serial gates each connected between each of the serial registers and one data line of the data line pair; and a control circuit for, when data stored in one of the memory cells is stored in one of the serial registers, activating a word line of the memory cell to read out the data stored in the memory cell to the bit line pair, and further activating one of the sense amplifier corresponding to the bit line pair, to transfer data from the sense amplifier to the serial register via the transfer gate connected to the sense amplifier for refreshment of the serial register, the data of the serial register being kept held by repeating the refreshment.

20. The memory device of claim 19, wherein the control circuit comprises:

a refresh control section for outputting refresh addresses of a memory cell array composed of the memory cells;

a word line control section for turning on the word line connected to the memory cell corresponding to the serial register to be refreshed, to read out data from the memory cell to the bit line pairs and thereby to activate the corresponding sense amplifier;

a transfer gate control section for turning on the transfer gate connected to the activated sense amplifier, to transfer data from the activated sense amplifier to the corresponding serial register; and a compare circuit for comparing an address of a memory cell outputted data stored in the corresponding serial register with a refresh address outputted from the refresh control section, and activating the transfer gate control section only when both addresses match each other.

21. The memory device of claim 20, wherein the refresh control section comprises a counter for holding a refresh address and selecting the word line in sequence by counting up control signals inputted thereto.

22. The memory device of claim 21, wherein the word line control section turns on a word line and then activates the corresponding sense amplifier.

23. The memory device of claim 22, wherein the word line control section comprises a delay circuit for realizing a delay between when the word line is turned on and when said sense amplifier is activated.

24. The memory device of claim 19, wherein the second and third transistors of each of the serial registers are N-channel transistors.

* * * * *